United States Patent
Suomi et al.

(10) Patent No.: US 8,046,210 B2
(45) Date of Patent: Oct. 25, 2011

(54) COMPUTER-AIDED MODELING

(75) Inventors: Jukka Suomi, Espoo (FI); Teemu Heikkonen, Helsinki (FI); Ragnar Wessman, Espoo (FI); Pertti Alho, Helsinki (FI); Ville Rousu, Espoo (FI)

(73) Assignee: Tekla Corporation, Espoo (FI)

( * ) Notice: Subject to any disclaimer, the term of this patent is extended or adjusted under 35 U.S.C. 154(b) by 1002 days.

(21) Appl. No.: 11/285,287

(22) Filed: Nov. 23, 2005

(65) Prior Publication Data

US 2006/0136398 A1    Jun. 22, 2006

Related U.S. Application Data

(60) Provisional application No. 60/635,980, filed on Dec. 15, 2004.

(30) Foreign Application Priority Data

Nov. 25, 2004    (FI) ..................... 20045459

(51) Int. Cl.
*G06F 9/44* (2006.01)
*G06F 13/10* (2006.01)
*G06F 13/12* (2006.01)
*G06F 9/45* (2006.01)
*G09G 5/00* (2006.01)

(52) U.S. Cl. ............... 703/22; 703/21; 345/619
(58) Field of Classification Search .......... None
See application file for complete search history.

(56) References Cited

U.S. PATENT DOCUMENTS

| | | | |
|---|---|---|---|
| 5,815,415 A * | 9/1998 | Bentley et al. | 703/4 |
| 6,021,270 A | 2/2000 | Hanaki et al. | |
| 7,082,386 B2 * | 7/2006 | Srinivasa | 703/2 |
| 7,280,990 B2 * | 10/2007 | Turner et al. | 706/45 |
| 2004/0177089 A1 * | 9/2004 | Love et al. | 707/103 R |
| 2006/0136398 A1 * | 6/2006 | Suomi et al. | 707/3 |
| 2006/0143176 A1 * | 6/2006 | Mojsilovic et al. | 707/6 |
| 2008/0056581 A1 * | 3/2008 | Yamaguchi et al. | 382/203 |

FOREIGN PATENT DOCUMENTS

EP    0 314 594    3/1996

OTHER PUBLICATIONS

Mantyla, "A modelling system for top-down design of assembled products", IBM J. Res. Develop, vol. 34 (1990) 636-659.

* cited by examiner

*Primary Examiner* — Rehana Perveen
*Assistant Examiner* — Raheem Hoffler
(74) *Attorney, Agent, or Firm* — Young & Thompson

(57) ABSTRACT

To enable the utilization of a definition or definitions once made as the definitions of a similar object, a set of conditions for similarity comprising one or more conditions is defined (201) and a set of definitions (202), which explicitly or inexplicitly indicates one or more definitions, of which at least one will be applied, and a similar object is searched for (203). If the set of definitions is related to an object which was used as the basis for defining the set of conditions for similarity, the set of definitions is applied to the object found. If the set of definitions is related to an object to be found, the set of definitions of the object found is applied to the object which was used as the basis for defining the set of conditions for similarity.

24 Claims, 3 Drawing Sheets

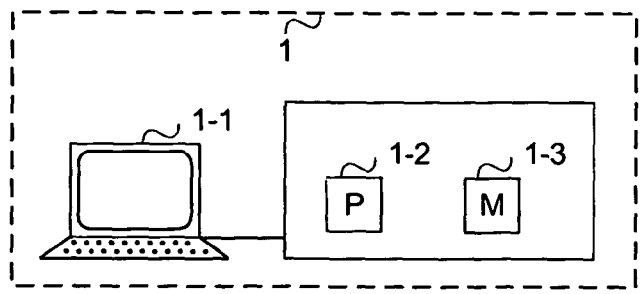

FIG.1

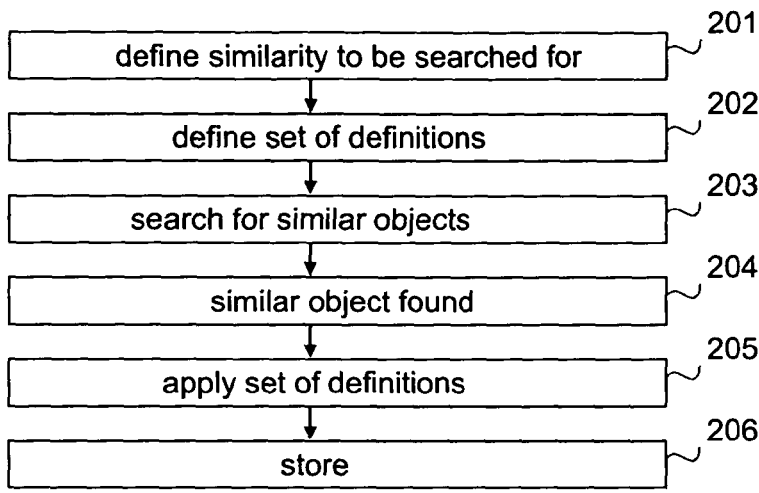

FIG.2

| | 5-A | 5-B | 5-C |
|---|---|---|---|
| 5-1 | detail use | drawing definition | create drawing |
| 5-2 | basic form | family identifier | give same family identifier |
| 5-3 | logically corresponding situation | definitions of object found | part |
| 5-4 | object | modification (object/part/attribute) | perform corresponding modification |
| 5-5 | joint entities/parts | attributes of entities/joints | modification of joint |
| 5-6 | joint with the best match for this | joint definitions | joint |
| 5-7 | logically corresponding use(s)/part(s) with drawing definition(s) | drawing definition(s) of object(s)/detail(s)/part(s) found | create drawing(s) |

FIG.5

COMPUTER-AIDED MODELING

FIELD OF THE INVENTION

The invention relates to computer-aided modeling and particularly to definitions of the modeled object.

BACKGROUND OF THE INVENTION

Modeling means that a model is created from the object under design for describing the object to be manufactured. The development of data processing systems and computers has transformed modeling into a computerized process, where a product model is created from the object. For example, the product model of a building is an entity consisting of the product data on the life span of the building and building process. The product model of a building describes the product data of the building outlined in accordance with the product data model. The building product model may be stored as a database of a computer application or as a file suitable for data transfer. Computer applications describe the real-world building elements of the building using building element entities that are processed by the applications.

The modeling by means of computer applications involves two different approaches to modeling: bottom-up and top-down. The bottom-up approach is based on a principle of forming a piece from details; each edge of the piece is drawn in the program and the piece is formed as a sum of all details. The formation of pieces is facilitated by a library where all piece forms included in the design have been stored. A ready-made piece form can be selected from the library and its different parts may be given parameters, whereby several different pieces can be obtained from one piece form. If the number or order of edges changes, a new piece form is stored in the library. The top-down approach is based on the principle of providing a piece with details; a piece is created first and then provided with details. The top-down modeling has been facilitated by dividing an entity into smaller entities, such as separate building elements, joints and details programmed into the modeling program. The most typically used building elements can be created by combining smaller programmed entities known as program snippets. Objects are modeled by parametrizing, i.e. by giving start and end points as well as definitions defining various properties of the piece, such as location, material or type of cross section. Pieces can also be parametrized according to the environment. The top-down approach differs from the bottom-up approach also in that the piece form is not stored in the library but the outcome is only a set of the piece's parameters (set of definitions) in the design. There is no piece form library similar to the one employed in the bottom-up approach. Top-down modeling is described in greater detail in the applicant's U.S. patent application Ser. No. 11/165,043, corresponding to the applicant's Finnish application FI20045240, where the parametric modeling described represents top-down modeling.

A problem associated with top-down modeling is, in fact, caused by the lack of a piece form library, for which reason there is no link between identical and similar pieces. When a drawing, for example, is made of a piece, the user sets the desired view angles and measures for the drawing and the same drawing, more precisely the drawing template provided by the drawing, could be used for pieces of the similar type. In the bottom-up approach, this is easy in the case of a stored piece form because a drawing can be linked as a drawing template with a library element. In that case, the same drawing template can be used when a drawing is made of a piece created using the same piece form. In the top-down approach, this is not feasible because there is no piece form library, and thus the user has to make the drawing of each piece separately. The same problem comes up both in the top-down and in the bottom-up approach when a drawing is made of an object that is an entity consisting of several pieces or when detailed drawings are made of similar parts of a piece.

BRIEF DESCRIPTION OF THE INVENTION

The object of the invention is to provide a method and an apparatus implementing the method to solve the above-mentioned problems. The object of the invention is achieved by a method, modeling system and software product, which are characterized by what is stated in the independent claims. Preferred embodiments of the invention are described in the dependent claims.

The invention is based on detecting the problem and solving it by employing a mechanism which enables using a definition once made for an object in defining a similar object or as a basis for definition. It is sufficient to define a condition or conditions for similarity explicitly or implicitly, and a similar object is found on the basis of the conditions and either the definition of the similar object is applied to the object found or the definition of the object found is applied to the similar object. The object refers to any created object, regardless of whether it is an entity assembled from several objects (an object with sub-objects) or a part of an entity (sub-object). The similar object refers to an object that sufficiently resembles another object. Whether an object sufficiently resembles another is defined by means of the conditions for similarity.

An advantage of the invention is that a definition once made or a definition set consisting of several definitions need not be re-made regardless of whether the definition is related to an object formed by a single piece, to an object formed by several pieces or to an object which is part of a larger entity. A further advantage is that the definition is applicable to a similar object, i.e. the object needs not be identical.

BRIEF DESCRIPTION OF THE FIGURES

The invention will now be described in greater detail by means of preferred embodiments with reference to the accompanying drawings, in which FIG. 1 is a simplified block diagram of the architecture of an exemplary system;

FIG. 2 illustrates a mechanism according to the invention;

FIG. 5 is a table illustrating different embodiments of the mechanism.

DESCRIPTION OF SOME EMBODIMENTS OF THE INVENTION

Figure 3:
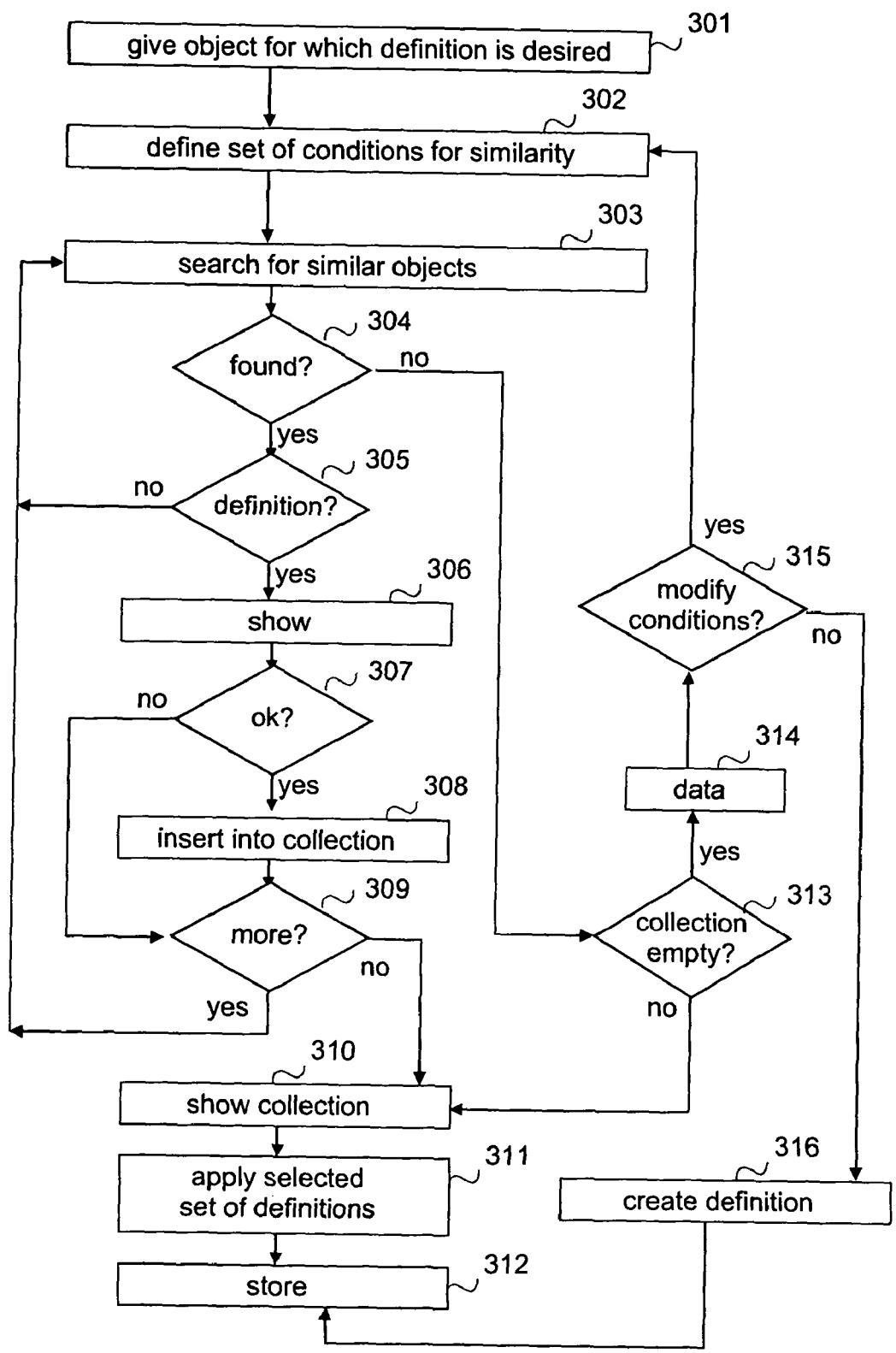
FIG. 3 is a flow chart illustrating an embodiment of the invention.

The present invention is applicable to any computer-aided modeling system where an object may be associated with definitions, which may be either definitions or grounds for definitions for similar objects or which may be derived from the definitions of a similar object.

In the following, the invention will be described by using an exemplary system where the program of the invention is run in a personal computer by utilizing a run-time database comprising information to be stored and already stored in a disc memory of the computer on the entire object modeled/to be modeled, for instance a building, without restricting the invention thereto. In another embodiment of the invention, an object-oriented database or a relation database, for example, can be utilized and used over a network from one or more terminals, for instance. Various programming techniques, storage of data in memory and manners of implementing databases develop constantly. This may require extra changes in the invention. Consequently, all terms and expressions should be interpreted broadly, and they are intended to describe, not to restrict, the invention.

FIG. 1 illustrates a simplified modeling system describing only the essential parts of the logical units of the system whose implementation may deviate from what is presented. It is obvious to a person skilled in the art that the system may also comprise other functions and structures that need not be described in greater detail here. The more detailed structure of the system is irrelevant to the actual invention.

The modeling system 1 illustrated in FIG. 1 comprises a personal computer provided with a user interface 11, processor 12 and memory 13.

The user interface 11 is the interface of the user, i.e. the person processing the model, to the modeling system. The user can create a model, modify a model, study it, and print desired figures and reports of it, etc. For example, the manner of inputting information into the modeling system to be described later is irrelevant to the invention.

In accordance with the different embodiments of the invention, the processor 12 carries out tasks according to the invention. The memory 13 comprises, for example, program snippets defined as part of a program, which constitute "program libraries", and data stored/to be stored during modeling, such as object definitions. In the exemplary system, data are stored in the memory in a file, for instance, and during processing the data constitute a "run-time database" in the central memory where they are read from a disk memory and where they can be processed faster. When the processing ends, the run-time data of the database, or at least the modified data, are stored in the disk memory. It is obvious to a person skilled in the art that data can be stored in one or more files and/or they can be stored/processed in another form and/or by using other memories.

The modeling system illustrated in FIG. 1 represents the simplest modeling system. In larger modeling systems, the user interface may be a terminal and the memory a database with which the terminal communicates via a server. The server performs functions of the processor of the exemplary system, or at least some of them, allowing also the terminal to carry out functions of the processor of the exemplary system. There may be one or several networks between the terminal and the server. They may comprise several terminals and servers with databases, which are preferably integrated to be visible to the modeler as one database and one database server. Whether the functions of the system to be described in the following are performed in a terminal, in a database server or so that some of them are performed in a terminal and some in a database server, i.e. the location where the database data are processed, is irrelevant to the invention.

FIG. 2 is a flow chart illustrating the basic functionality of the mechanism according to the invention. In other words, it shows the functionality according to the invention in a very simplified manner. Usually, the need to search for similar objects initiates the mechanism according to the invention.

FIG. 2 starts from step 201, where the similarity to be searched for is defined. The similarity to be searched for is typically defined by giving one or more conditions for similarity. These conditions (or the condition) constitute a set of conditions for similarity. The set of conditions may include various search criteria, tolerances and/or limit values. A condition (or conditions) may be defined for example by a user by giving conditions for similarity or by a modeling program by analyzing objects in a drawing, or the user may supplement and/or modify the conditions provided by the modeling program. The conditions (or the condition) for similarity may depend on the use, i.e. what initiates the search for similar objects, and the modeling program may be configured to determine the conditions from the use. The invention does not in any way limit the nature of the similarity conditions or how they are defined. Examples of defining similarity are described in connection with FIGS. 4A and 5.

Figure 4A:
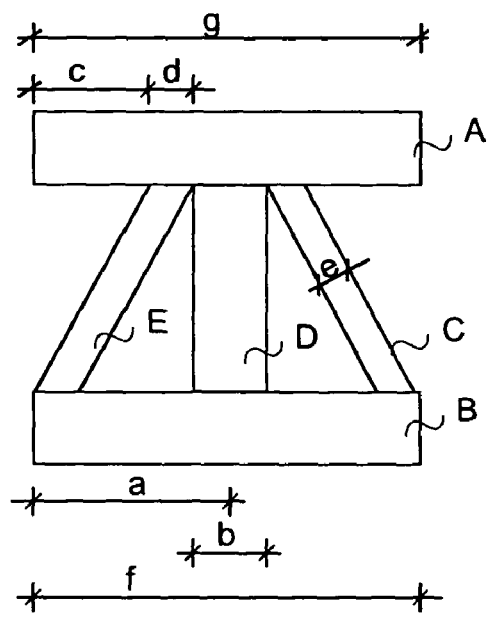
FIGS. 4A, 4B and 4C illustrate the application of the mechanism according to the invention in the creation of drawings.

After the similarity to be searched for has been defined, a set of definitions indicating explicitly or inexplicitly the definition or definitions that is/are to be applied is defined in step 202. In principle, the set of definitions can be applied either to the object found by means of the conditions for similarity or to the object used in defining the conditions for similarity. The set of definitions can thus explicitly or inexplicitly indicate the object to which it is applied. The set of definitions may also include an object that becomes part of the object to which the set of definitions is applied. The invention does not in any way limit the nature of the set of definitions or how it is defined. Examples of a set of definitions are illustrated in FIGS. 4A and 5.

After this, similar objects are searched for (step 203). This may be performed, for example, by searching for objects having as their parameter the same piece type (for example the piece number), the same profile type (for example the type number), the same name and/or local position, such as position in a model, for example third-floor beams, location within the object, for example distance from an end, or relative location, for example the distance of a beam from an end, or relative location, for example at the end of a beam. A similar object can be searched for in the data of one model, or in the data on earlier models, which may have been stored in a database or in a databank, which may be in the Internet, for instance. The invention does not in any way limit the manner in which similar objects are searched for, where they are searched for, or where the data have been stored. The object is similar when it fulfils the condition or conditions defined for similarity in step 201.

Figure 4B:
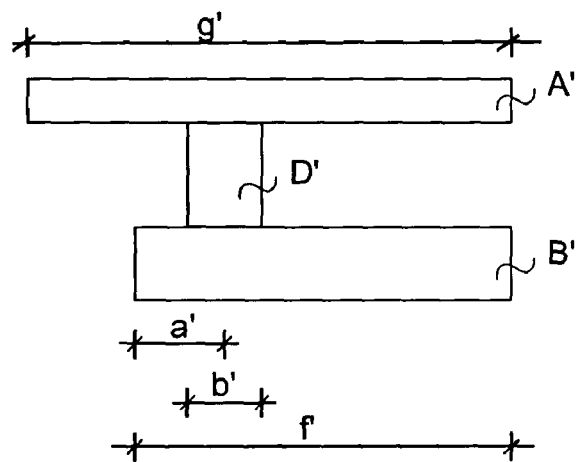
Figure 4C:
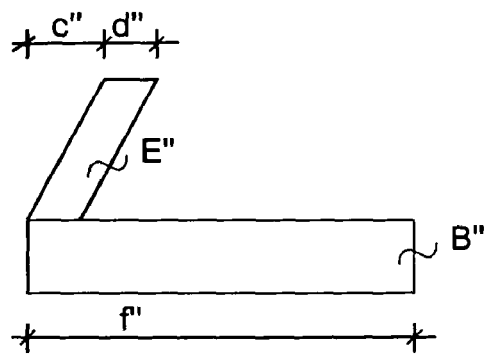

When a similar object is found (204), the set of definitions (step 205) is applied either to the object found or to the object used in defining similarity. As stated above, the set of definitions may indicate where the set of definitions is to be applied. In some embodiments, the user may define where the set of definitions is applied or the modeling program may comprise means for concluding the object of applications or means for inquiring the object of application. FIGS. 4A, 4B and 4C illustrate this application step.

After the applying has been finished, the applied set of definitions or a link to the set of definitions to be applied can be stored (step 206) in connection with the object to which it was applied. Thus the stored definitions or link preferably become part of the definitions of the object in question and are applicable to another object.

FIG. 3 is a flow chart illustrating an embodiment according to the invention where definitions of the object found on the basis of similarity are applied to an object. The function shown in FIG. 3 may be initiated by a drawing command from the object, for instance.

FIG. 3 starts from step 301, where an object for which a definition is to be obtained is given. This can be carried out by giving a command "create a drawing for this object". At the same time, a set of definitions is defined implicitly. Then a set of conditions for similarity is defined separately in step 302 in this embodiment. The user may define it by selecting, for example, the parts or pieces of an object that belong to the desired situation. In addition, the user may define how many pieces or what kind of pieces the object must at least contain for the object to be similar. The set of conditions may also include conditions on which parts should be connected to each other and how close to each other certain parts must be. The set of conditions may also include a condition that a similar object must be found in the model.

Then similar objects are searched for in step 303. If an object fulfilling the set of conditions is found (step 304), it is checked in step 305 whether the object found has the desired definition (for example drawing definitions). If the object does not have one, the method returns to step 303 to search for similar objects. If the object has one (step 305), the object found and its definitions are shown to the user in step 306 and the user is asked whether the object found and its definitions are the desired ones (ok). If the user thinks that they are (step 307), the object is placed in the collection of found objects in step 308 and in step 309, the user is asked whether he wants to search for more similar objects. The method proceeds directly to this step 309 from step 307 if the user thinks that the object found is not the desired one. If the user wants to search for more objects, the method returns to step 303, where more objects are searched for.

If the user does not want to search for more objects (309), the collection of found objects is shown to the user in step 310 so that he can select the object whose definitions are to be applied from among the found objects. After the user has made the selection, the definitions of the found object are applied in step 311 to the object given in step 301, and in step 312, the definitions or link to the definitions thus obtained are stored. The stored definitions can be employed in the application, for example, exactly in the same way as the definitions created by prior art methods.

If no more similar object was found or no similar object was found at all (step 304), it is checked in step 313 whether the collection of found objects is empty. If it is not, the method continues from step 310, where the collection of found objects is shown to the user.

If the collection of found objects is empty (step 313), the user is informed in step 314 that no objects in accordance with the conditions were found and the user is asked whether he wants to change the conditions for similarity. If the user wants to change the conditions for similarity (step 315), the method will continue from step 302, where a set of conditions for similarity is defined. If the user does not want to change the conditions for similarity (step 315), in this example, he has to create a definition in step 316 that is then stored in step 312.

In an embodiment according to the invention, the nature of the object that was selected can also be stored in connection with step 311 as described above. The mechanism according to the invention may utilize this information when searching for the next similar object; for example, the mechanism may offer the most suitable object by default, and if the user does not regard it as suitable, search for other objects conforming to the conditions as described above. A databank of default values is created at the same time.

In an embodiment according to the invention, the set of conditions may be hierarchic; for example, the user may have defined a hierarchy for the conditions or the mechanism according to the invention may have created a hierarchy. This hierarchy can be employed in the search for similar objects as follows, for instance: if similar objects in accordance with the conditions are not found, the conditions of the lowest hierarchy level are deleted from the set of conditions and similar objects are searched for on the basis of the remaining conditions.

Information on which object and/or object definition has been utilized, how it has been utilized, how many times and by whom can be stored. This information may be used, for example, in selecting objects and definitions to be stored in a databank. The information can also be utilized by searching for objects fulfilling the set of conditions or by selecting the objects to be shown to the user from among the objects fulfilling the set of conditions based on how the objects have been used earlier.

The steps illustrated in FIGS. 2 and 3 are not in an absolute chronological order and they can be performed deviating from the given order or simultaneously. Some of the steps, such as the storing step 206 in FIG. 2, the display step 306 in FIG. 3 or other corresponding steps related to the user's interaction, can also be omitted or replaced by definitions/settings made in the modeling program. For example, the modeling program may include a setting according to which three objects that fulfill the conditions best are always shown to the user and, if the conditions for similarity are strict and thus three objects are not found, the program may be configured to modify the conditions for similarity, for example to drop the last condition. The steps described above or only some of them can be repeated on the sub-objects of the object in the applying step, for instance. Other functions may be performed between the described steps or simultaneously with them. For example, after step 310 in FIG. 3, the user could be asked whether the found objects are sufficient or whether he wants to change the conditions, after which the process continues according to the user's answer.

FIGS. 4A, 4B and 4C illustrate application of the mechanism according to the invention in the creation of drawings by means of an example. FIG. 4A illustrates the defining of similarity and a set of conditions, and FIGS. 4B and 4C illustrate the application of the set of conditions. In the creation of drawings, logical definitions are preferably employed, which are explained in greater detail in the applicant's U.S. application Ser. No. 10/840,250, which is incorporated herein by reference.

FIG. 4A illustrates a drawing created for an object which has been adapted to the desired form and stored as drawing data in the model. Then this model is used as the drawing template for the drawings of similar objects. The user or the modeling program or the user and the modeling program together define an object having parts similar to part B (for example the same piece type) and a part similar at least to part E, D or C as conditions for similarity. The conditions for similarity may also include other conditions, such as a condition related to the object location. The set of definitions is defined either by the user, who gives a command "create corresponding drawings for other corresponding objects", for example, or the modeling program determines the set of definitions. In this example, the set of definitions will thus consist of the definitions for the drawings of FIG. 4A, i.e. measures a, b, c, d, e, f and g so that measure g is assigned to part A, measure f to part B, measure e to part C, measures a and b to part D, and measures c and d to part E. The modeling program preferably knows the set of definitions since the drawing was processed, and consequently, the user does not need to define the set of definitions separately.

After this, the modeling program goes through the whole model and searches the model for objects that fulfill the conditions for similarity defined above and, always after finding an object/objects, repeats the adjustment of definitions. The definitions are adjusted using the definitions in the drawing template of FIG. 4A, by searching for the counterparts of the original object (i.e. FIG. 4A) and the object found, by checking the definitions related to them and by associating the drawing template with the object found (i.e. by storing the adjusted drawing or a link to the drawing definitions of FIG. 4A).

In this example, the modeling program finds the objects of FIGS. 4B and 4C in the model. After the object of FIG. 4B has been found, counterparts are searched for. In the case of the object of FIG. 4B, A' corresponds to the original A, B' to the original B and D' to the original D. No counterparts were found for the original E and C. Then the set of definitions is applied: measure g' is assigned to part A', measure f' to part B' and measures a' and b' to part D', after which the drawing of FIG. 4B is shown to the user and it can be stored in the model or a link to drawing 4A can be stored as the drawing of FIG. 4B.

Counterparts are also searched for after FIG. 4 C has been found. In FIG. 4C, B" corresponds to the original B and E" to the original E but no counterparts are found for the other parts. Thus the drawing will only include measure f' for B" and measures c" and d" for E", after which the drawing of FIG. 4C is shown to the user and it can be stored in the model or a link to drawing 4A can be stored as the drawing of FIG. 4C.

The mechanism could also be employed reversely: for example, after having modeled the object of FIG. 4C, the user could give all the parts included in the object as the condition for similarity, define a set of definitions by giving a command "create a drawing", in which case the drawing definition of a similar object will constitute the set of definitions. Having found object 4A and its drawing definitions, the modeling program would apply these to the object of 4C, which would yield the drawing shown in FIG. 4C as the outcome.

Yet another alternative to employ the mechanism is based on assumption that drawing definitions shown in FIGS. 4B and 4C are stored in a databank, for example. After having modeled the object of FIG. 4A (or FIG. 4A could be the whole model), the user may give a command "create a drawing". In response to the command, the modeling program starts to search for objects with drawing definitions, which objects, or parts of objects, logically correspond to some part of the modeled object. Having found objects 4B and 4C with their drawing definitions, the modeling program would apply these to the object of 4A, which would yield the drawing shown in FIG. 4A as the outcome with the exception that measure "e" would be missing and the user would have to add it, i.e. modify the outcome. Depending on the implementation or the user commands, the modeling program may also provide detail drawings of the object of 4A, the detail drawings resembling drawings in FIGS. 4B and 4C but having the measures of the object of 4A.

The table in FIG. 5 illustrates other examples of the ways in which the mechanism can be used. Column 5-A shows various conditions for similarity, column 5-B definition sets and column 5-C use.

The example shown in row 5-1 of the table in FIG. 5 is also related to the drawings. For example, if desired, a drawing of a detail can be inserted into the drawing of an object by utilizing drawing definitions of a similar detail already stored in the model or databank. When new drawings are created or old ones modified (due to a modification of the model, for example), the model (or databank) can be searched for a drawing detail for a similar use. The condition for similarity is thus a similar use (the parts that are related to each other this way), and the set of definitions consists of the drawing definitions of the detail that are applied as described above by identifying counterparts and updating the drawing data to conform to the counterpart. In an embodiment, the user may specify the conditions for similarity by giving, for example, the following further conditions "at least one part here and one part there, at least these parts must be present or these parts need not be present". The drawing can be compiled from sub-entities by going through all the details related to the object. A dedicated detail drawing can be made of each detail or each different detail. If, for example, a beam is fastened at its ends and a lower beam is attached to the middle of the beam, the beam has different fastening details at the ends and in the middle. In that case, the drawing of the beam can be created by searching for a dedicated drawing template both for the beam and each detail; on the basis of the part for the beam and on the basis of the use for the details. When the drawing template is found, counterparts are searched for, measurements updated and a drawing compiled from the drawing part obtained on the basis of the drawing template for the beam and from the drawing parts obtained on the basis of the drawing templates for the details. In an embodiment, the program is further configured to identify exactly the same details and print only one drawing of them.

The example illustrated in row 5-2 in the table of FIG. 5 is related to controlling the manufacturing process. It allows finding the objects belonging to the same family in the model, i.e. the objects having a similar manufacturing process. For example, the same mold can be used in the casting of various concrete parts having different fittings or in the compilation of trusses having different fittings by the same template (scheme). These parts are found when a similar basic form is defined as the condition for similarity. Since the conditions for similarity include no details, objects having differing details but belonging to the same family can be found. The objects found by means of the family identifier can further be classified utilizing the similarity, which enables a better controlling of the manufacturing process. Classification can be carried out by giving the material used and/or similar details within certain tolerances as the condition for similarity. Thus the mechanism according to the invention also allows finding non-identical objects under the same family identifier. For example, beams having different lengths and manufactured in the same mold can be given the same identifier.

The example in row 5-3 in the table of FIG. 5 illustrates how the mechanism according to the invention can be employed in the creation of new building elements when the creation starts from a schematic part. In that case, the condition for similarity is defined as the object that has been in a logically corresponding situation and the object definitions constitute the set of definitions. Then an object that has been in a logically corresponding situation is searched for in the model or databank, for instance. When/if such is found, the definitions are applied by modifying the schematic part to correspond to the object found. Naturally, parameters dependent on the location and surrounding objects are updated at the same time and a new part (object) or a link to the data for creating it are stored in the model data.

The same principle and definitions can also be applied without the schematic part when, for example, the modeling program, on analyzing loads, notes that one part will not sustain the loads to which it is subjected and starts searching for an object that has been in a logically corresponding situation for that object.

The example in row 5-4 in the table of FIG. 5 illustrates how the mechanism according to the invention also allows propagation of the modification made to the object to other corresponding objects of the model. The following can be given as the condition for similarity: the object on which the modification has been performed, the object and parts related to it, parts included in the object, other objects and/or their relative location to one another. This way the conditions for similarity may ensure that the modification will be carried out on all the parts on which it should be but not necessarily on all parts with the same form. The modification made to the object constitutes the set of definitions. When a similar object is found, the definition is applied by copying the modification into the corresponding point. If, for example, a stiffening member were to be added to part B in FIG. 4A and the same conditions for definitions were given as earlier in connection with FIGS. 4A, 4B and 4C, the stiffening member would also be copied into parts B' and B". If objects including parts A, B, C, D and E were defined as similar, the stiffening member would not be copied into the object of FIG. 4B or into the object of FIG. 4C. This enables the modification of all similar objects or objects in a similar situation, for instance.

This propagation of the modification made to an object can also be used in modifying a part of an object, such as carry handles or different loops suitable for lifting and/or carrying. In that case, the condition for similarity may be, for example, "a lifting loop at the top edge of the object". The same propagation can also be employed in the copying of the properties of an object or an object part. For example, if an object having one attribute more than similar earlier object has been modeled, the model is searched for similar objects and the same attribute is copied into them. Naturally, the value of the attribute is updated, if necessary.

The same principle related to modification can also be employed in updating joints since, in the top-down approach, the final form of the objects depends on the size and position of the parts related to the object and on the joints used. When the model changes, joints must be updated. In updating the joints, it is advantageous to retain the parts already created if the corresponding parts also exist in the situation following the modification. The mechanism according to the invention allows identification of any counterparts between the old and the modified status of the object by means of the conditions for similarity, modification of the counterparts to correspond to the new situation brought about by modification, creation of the new parts created in the modification and removal of the parts deleted in the modification. This way it can be ensured that modifications and additions made to single parts are retained and propagated. This also has the advantage that it eliminates the problem associated with some prior art solutions which do not include a separate "modify" function but modifications are made by means of the "create" and "remove" functions, whereby the old parts of a joint cannot recognize a modified part, which is, in fact, an old part. Now old parts will "notice" similarity.

The example in row 5—5 in the table of FIG. 5 illustrates the application of the mechanism according to the invention in situations where part of a joint, for example, changes. It is irrelevant into which the part changes. The entities/parts included in the joint concerned can be defined as the conditions for similarity and their attributes as the set of definitions. The command "modify joint" given to the application includes associating the entities/parts of the joint and their attributes and links with the new situation and the joint with its links are adapt to the new situation.

In the prior art top-down approach, the designing of joints is facilitated by defining and storing various joints in program libraries, from which the program selects the correct joint on the basis of certain rules (joint selection rules) depending on the joint situation or on the joint to be achieved, for example what kind of beams are joined together. The invention simplifies the reaction of the selected joint to modifications as well as the selection of joints without joint selection rules.

Row 5-6 in the table of FIG. 5 illustrates an example of how a correct joint can also be selected utilizing the mechanism according to the invention without defining the joining situation. When "the best match for this joint location", for example "the best match when a beam is joined with a beam that is twice as high", is set as a condition for similarity and the set of definitions of the best match as the set of definitions, the set of definitions is applied by creating a joint in accordance with the best match at the joining point, naturally by adjusting the measures. The modeling program preferably defines the conditions for similarity. Thus the joint is found without rules and the model is, in a way, taught that a certain joint belongs to a certain logical situation. "A similar location for a joint" can also be defined as the condition for similarity, "joint" or "joint parameters" as the set of definitions and "create a joint" or "give parameters to the joint" for application, and thus the model can be provided with a correct joint and/or the joint with correct parameters. Compared to the rule-based solution, the mechanism according to the invention provides a more generic solution for designing joints. The mechanism functions in a corresponding manner when a selected joint should react to modifications.

In view of the above, it is clear that the mechanism according to the invention can also solve problems other than the modeling problems related to drawings. The mechanism solves the problems caused in the top-down approach by the lack of object library in the bottom-up approach but also problems that exist even though the library were available. For example, since a modification is propagated by means of a library object, the modification will be included in all objects created by this library object regardless of where they are. The mechanism according to the invention enables focusing the propagation of modification better. The invention also speeds up the performance of modifications; for example, the cross section of a through hole can be modified by the mechanism according to the invention without having to carry out the modifications one at a time.

The example shown in row 5-7 of the table in FIG. 5 is also related to the drawings. It differs from the example shown in row 5-1 in that objects corresponding to objects having already drawing definitions are searched for in a model, and one or more drawings are made for the model on the basis of the found drawing definitions. In other words, it illustrates a situation in which drawings of an object (or even drawings of a whole model) including detail drawings will be created preferably automatically utilizing already existing drawing definitions, so called template drawings, stored in the model or in a databank, for example. In that case, the condition for similarity is defined as an object or part of an object for a logically similar use and having drawing definitions, and the set of definitions consists of the drawing definitions of the found object that are applied as described above by identifying counterparts and updating the drawing data to conform to the counterpart. In other words, if a drawing template for a logically similar structure is found, a drawing for that part of the modeled object is created. The drawing thus created may be later combined with other corresponding drawings in order to obtain a drawing for the whole object modeled. The thus created drawing may also be used later as a template drawing.

The example of row 5-7 can be used, for example, to assist with decisions on which kind of drawings are to be made from a model. For example, such details/parts of a model may be searched for which correspond to details/parts for which drawings have been made in another model, and preferably each time such a detail/part is found, a drawing is created. It is also possible to search for logical structures from which a drawing is typically made and preferably each time such a logical structure is found, a drawing is created. Information on such logical structures may be maintained in the modeling program, in a database, in a databank, or in the Internet, for example. The examples and embodiments given above may be combined with the example of row 5-7.

Even though the invention was described above by means of examples where the mechanism according to the invention was utilized in the creation of a product model, it is obvious to a person skilled in the art that it is also applicable to other modeling-related functions.

The modeling system implementing the functionality according to the invention comprises, in addition to the means required in prior art modeling, means for finding similar objects and for applying a set of definitions defined for an object to another object. More precisely, it comprises means for implementing at least one of the embodiments described above. Existing personal computers or terminals and database servers comprise processors and memory that are applicable in the functions according to the invention. All the modifications and configurations required by the implementation of the invention can be executed as added or updated software routines, by application circuits (ASIC) and/or by configuring an existing system in some other way, in particular a modeling program. The software/software routine(s) can be stored in any computer-readable storage medium.

It is obvious to a person skilled in the art that, as technology advances, the inventive concept can be implemented in various ways. The invention and its embodiments are thus not limited to the examples described above but they may be varied within the scope of the claims.

The invention claimed is:

1. A method of utilizing the definition of a first object modeled by means of a computer program for computer-aided modeling, the method comprising:
    defining, by means of the computer program for computer-aided modeling, a set of definitions of a first situation, the set of definitions indicating explicitly or inexplicitly at least one definition amongst definitions of the first object that represents a real world article modeled by using the computer program for computer-aided modeling, the at least one definition of the first object relating to the first situation and being defined by means of the computer program;
    defining, by means of the computer program for computer-aided modeling, a set of similarity conditions comprising at least one similarity condition defining upon a situation being similar enough with the first situation;
    searching, by the computer program for computer-aided modeling from a memory, for a second object in a situation fulfilling the set of similarity conditions, the second object representing another real world article modeled by using the computer program for computer-aided modeling;
    finding, by the computer program for computer-aided modeling, at least one second object in a situation fulfilling the set of similarity conditions;
    applying, by the computer program for computer-aided modeling, the set of definitions, of the first situation to create a corresponding set of definitions to the at least one second object in the situation fulfilling the set of similarity conditions; and
    removing one or more conditions from the set of similarity conditions in response to the fact that a predetermined number of second objects fulfilling the set of similarity conditions were not found.

2. The method according to claim 1, wherein
    the set of definitions comprises drawing definitions of the first object; and
    on applying the set of definitions, a drawing or a part of drawing of the second object is created in accordance with the drawing definitions of the first object.

3. The method according to claim 1, wherein
    the set of similarity conditions relates to a logically similar use for which the first object already has drawing definitions;
    the set of definitions comprises drawing definitions of the first object; and
    the set of drawing definitions of the first object is applied to the second object for creating a drawing or a part of drawing of the second object in accordance with the drawing definitions of the first object.

4. The method according to claim 3, wherein a logically similar use is searched for each existing drawing definition and if a logically similar use is found, a drawing or a part of drawing is created.

5. The method according to claim 1, wherein
    the set of similarity conditions comprises a condition or conditions related to the similarity of the manufacturing process;
    the set of definitions to be used comprises an identifier of the first object; and
    the same identifier is given to the second object upon the set of definitions being applied.

6. The method according to claim 1, wherein
    the set of similarity conditions comprises a logically corresponding situation;
    the set of definitions to be used comprises an attribute or attributes of the first object; and
    on applying the set of definitions, an object corresponding to the object found is modeled for the logically corresponding situation.

7. The method according to claim 1, wherein
    the set of similarity conditions comprises an additional condition according to which an object best corresponding to the rest of the set of similarity conditions is selected;
    the set of definitions to be used comprises the set of definitions of the object with the best correspondence; and
    the set of definitions of the object with the best correspondence is used on applying.

8. The method according to claim 1, further comprising asking the user whether conditions should be removed before the removal of one or more conditions.

9. The method according to claim 1, wherein the second object in the situation fulfilling the set of similarity conditions is searched for in one of a model or databank.

10. The method according to claim 1, wherein the predetermined number is two or more, the method further comprising searching for at least a predetermined number of second objects fulfilling the set of similarity conditions; and selecting the one whose set of definitions is being applied.

11. A software product comprising a program stored in a program storage medium and readable by a computer, wherein the execution of the program on a computer makes the computer implement the following steps:
    defining a set of similarity conditions based on a first object representing a real-world article modeled by using the software product, the set of similarity conditions comprising at least one similarity condition defining upon a situation being similar enough with a first situation;

defining a set of definitions indicating explicitly or inexplicitly one or more definitions of which at least one will be applied, the definitions being defined by means of software product;

searching for a second object fulfilling the set of similarity conditions, the second object representing another real-world article modeled by using the software product;

applying the set of definitions, wherein if the set of definitions relates to the similar situation they are applied to the first situation and if the set of definitions relates to the first situation, they are applied to the similar situation; and removing one or more conditions from the set of similarity conditions in response to the fact that a predetermined number of second objects fulfilling the set of similarity conditions were not found.

12. The software product according to claim 11, wherein the set of definitions is related to the first object; and the execution of the program on the computer makes the computer apply the set of definitions to the second object.

13. The software product according to claim 11, wherein the set of definitions is related to the second object; and
the execution of the program on the computer makes the computer apply the set of definitions of the second object to the first object.

14. A computer system comprising:
a computer comprising a computer program for computer-aided modeling, the computer program causing, when executed, the computer to:
create a first and a second object both representing real-world articles and being created by defining a set of definitions;
define a set of similarity conditions based on the first object, the set of similarity conditions comprising at least one similarity condition defining upon a situation being similar enough with a first situation;
define at least one definition for the first object indicating explicitly or inexplicitly one or more definitions of which at least one will be applied;
identify, by using the set of similarity conditions, whether the first situation of the first object and a situation of the second object are similar enough; and
apply a definition of the first object to the second object in response to the situations being similar enough; and
remove one or more conditions from the set of similarity conditions in response to the fact that a predetermined number of second objects fulfilling the set of similarity conditions were not identified.

15. The computer system according to claim 14, further comprising at least one of the following: a memory comprising a model, an internal databank of the system, and a databank in the Internet, wherein the computer is further programmed to search for objects in similar enough situations at least from one of the model, the internal databank and the databank in the Internet.

16. A method comprising:
defining, by means of a computer program for computer-aided modeling, a set of similarity conditions comprising at least one similarity condition defining upon a situation being similar enough with a first situation, the first situation relating to a first object representing a real-world article and being modeled using the computer program for computer-aided modeling;
searching by the computer program for computer-aided modeling from a memory for a situation fulfilling the set of similarity conditions;
finding, by the computer, a similar situation, the similar situation relating to a second object representing another real-world article and being modeled using the computer program for computer-aided modeling;
defining, by means of the computer program for computer-aided modeling, a set of definitions of the similar situation, the set of definitions indicating explicitly or inexplicitly at least one definition amongst definitions of the second object that relate to the similar situation; and
applying by the computer program for computer-aided modeling, the set of definitions of the similar situation to create a corresponding set of definitions to the first object; and
removing one or more conditions from the set of similarity conditions in response to the fact that a predetermined number of situations fulfilling the set of similarity conditions were not found.

17. The method according to claim 16, wherein the predetermined number is two or more, the method further comprising searching for at least the predetermined number of second objects fulfilling the set of similarity conditions; and selecting the one whose set of definitions is being applied.

18. The method according to claim 17, further comprising storing data on the selected second object and on how the second object has been used; and
utilizing the stored data in the search for second objects.

19. The method according to claim 16, wherein
the set of definitions comprises drawing definitions of the second object; and
on applying the set of definitions, a drawing or a part of drawing is created for the first object in accordance with the drawing definitions of the second object.

20. The method according to claim 16, wherein
the set of similarity conditions comprises a condition or conditions related to the similarity of the manufacturing process of real-world articles;
the set of definitions to be used comprises an identifier of the second object; and
the same identifier is given to the first object upon the set of definitions being applied.

21. The method according to claim 16, further comprising asking the user whether conditions should be removed before the removal of one or more conditions.

22. The method according to claim 16, wherein a second object in a situation fulfilling the set of similarity conditions is searched for in a model or databank.

23. A method comprising:
defining, by means of a computer program for computer-aided modeling, a set of similarity conditions comprising at least one similarity condition a similarity condition defining at least one of the following: upon a model of a building element entity being similar enough to a model of a first building element entity, upon at least a part of a model of a building element entity being similar enough to at least a part of the model of the first building element entity, and upon a model of a building element entity being in a similar enough situation as the model of the first building element entity, each model being modeled using the computer program for computer-aided modeling;
defining, by means of the computer program, a set of definitions that will be used, the set of definitions indicating explicitly or inexplicitly at least one definition amongst the definitions in the model of the first building element entity;
searching, by the computer program for computer-aided modeling from a memory comprising models of building element entities modeled using the computer program for computer-aided modeling, for a model of a building element entity fulfilling the defined set of similarity conditions;

finding, by the computer program for computer-aided modeling, a similar model of a building element entity;

using, by the computer program for computer-aided modeling, the defined set of definitions to create a corresponding set of definitions to the similar model of the building element entity; and removing one or more conditions from the set of similarity conditions in response to the fact that a predetermined number of models of building elements fulfilling the set of similarity conditions were not found, wherein the models of the building element entities represent real-world building articles used in construction sites.

24. The method according to claim 23, wherein the predetermined number is two or more, the method further comprising searching for at least the predetermined number of second objects fulfilling the set of similarity conditions; and selecting the one whose set of definitions is being applied.

* * * * *